United States Patent
Liu et al.

(10) Patent No.: US 9,397,256 B2
(45) Date of Patent: Jul. 19, 2016

(54) LIGHT-EMITTING DIODE STRUCTURE HAVING PROGRESSIVE WORK FUNCTION LAYER

(71) Applicant: NATIONAL CENTRAL UNIVERSITY, Taoyuan County (TW)

(72) Inventors: Cheng-Yi Liu, Taoyuan (TW); Chih-Yi Hsieh, Taipei (TW); Yen-Shou Liu, Taipei (TW)

(73) Assignee: National Central University, Taoyuan County (TW)

( * ) Notice: Subject to any disclaimer, the term of this patent is extended or adjusted under 35 U.S.C. 154(b) by 0 days.

(21) Appl. No.: 14/321,888

(22) Filed: Jul. 2, 2014

(65) Prior Publication Data
US 2015/0243838 A1  Aug. 27, 2015

(30) Foreign Application Priority Data
Feb. 24, 2014  (TW) .............................. 103106103 A

(51) Int. Cl.
| | |
|---|---|
| H01L 31/00 | (2006.01) |
| H01L 33/06 | (2010.01) |
| H01L 33/00 | (2010.01) |
| H01L 33/10 | (2010.01) |
| H01L 33/40 | (2010.01) |
| H01L 33/32 | (2010.01) |

(52) U.S. Cl.
CPC ............ *H01L 33/06* (2013.01); *H01L 33/0008* (2013.01); *H01L 33/10* (2013.01); *H01L 33/40* (2013.01); *H01L 33/0079* (2013.01); *H01L 33/32* (2013.01); *H01L 33/325* (2013.01); *H01L 33/405* (2013.01)

(58) Field of Classification Search
CPC ......... H01L 33/06; H01L 33/58; H01L 33/12; H01L 33/0008; H01L 33/10; H01L 33/325; H01L 33/26; H01L 33/50; H01L 33/40; H01L 33/405; H01L 33/0079; H01L 33/32; H04B 10/11
See application file for complete search history.

(56) References Cited

U.S. PATENT DOCUMENTS

2011/0297217 A1* 12/2011 Barkhouse et al. ............ 136/255

* cited by examiner

*Primary Examiner* — Marc Armand
*Assistant Examiner* — Quovaunda V Jefferson
(74) *Attorney, Agent, or Firm* — Rosenberg, Klein & Lee

(57) ABSTRACT

The present invention relates to an LED structure having a progressive work function layer, which adopts a conversion layer with a gradually varying work function as the medium for forming an Ohmic contact between the p-type GaN and the metal reflection layer. The work function of the conversion layer is not a single value. Instead, different quantities of dopants are doped at different depths of the conversion layer. Thereby, the conversion layer can match excellently the connected p-type GaN and the metal reflection layer. By taking advantage of the high light transmissivity of the material of the conversion layer, the possibility that light is absorbed by the Ohmic contact layer is reduced. The conversion according to the present invention can also block diffusion of the metal in the metal reflection to the p-type GaN. Accordingly, it can be used as both an Ohmic contact layer and a barrier layer.

8 Claims, 5 Drawing Sheets

LIGHT-EMITTING DIODE STRUCTURE HAVING PROGRESSIVE WORK FUNCTION LAYER

FIELD OF THE INVENTION

The present invention relates generally to a light-emitting diode structure, and particularly to a light-emitting diode structure having a progressive work function layer realized by altering the work function of the conversion layer progressively by doping different number of dopants.

BACKGROUND OF THE INVENTION

Light-emitting diodes (LEDs) are a kind of solid-state light-emitting device made of semiconductor materials. They own the advantages of small size, low power consumption, and high reliability and are combinations of III-V chemical elements such as gallium phosphide and gallium arsenide. By applying a voltage to the semiconductor, holes and electrons will recombine under the action of different electrode voltages. At this time, electrons will fall to lower energy levels and release photons simultaneously. Thereby, light is emitted by converting electrical energy to photo energy.

In LED applications, we expect the metal-semiconductor interface in LED structures is an Ohmic contact. In other words, the contact resistance between the metal-semiconductor interface is extremely small, enabling LEDs to have linear and symmetric current-voltage characteristic curves. The formation of an Ohmic contact is related to the work function between the metal and the semiconductor. Take gallium nitride for example. For n-type gallium nitride, if the barrier height is to be eliminated and forming an Ohmic contact, a metal having a low work function should be used. Contrarily, for p-type gallium nitride, a metal having a high work function should be used.

Please refer to FIG. 1, which shows a thin-GaN LED. The structure thereof comprises a semiconductor layer 2, which comprises an n-type semiconductor layer 21, a multiple quantum well layer 23, and a p-type semiconductor layer 22. The p-type semiconductor layer 22 is just p-type gallium nitride. Below the p-type semiconductor layer 22, it comprises an Ohmic contact layer 8, a metal reflection layer 4, a bonding layer 5, and a substrate 6 sequentially. In addition, a first electrode 71 and a second electrode 72 are disposed on both ends of the LED.

The material of the Ohmic contact layer 8 is usually the combination of the metals nickel/gold/nickel/aluminum, which contains high-work-function metals such as gold and nickel for being used as the Ohmic contact. Although the contact resistance between the p-type semiconductor layer 22 and the metal reflection layer 4 can be reduced, its high absorptivity lowers significantly the light emitting efficiency of GaN LEDs.

In addition to high absorption coefficient and low thermal stability, the high-work-function metals adopted in the Ohmic contact layer 8 cannot prevent the metals in the metal reflection layer 4 from diffusing to the p-type GaN in the p-type semiconductor layer 22. Consequently, the electrical characteristics of the p-type GaN are affected.

Accordingly, for forming LEDs with high light-emitting efficiency, the technical problems to be solved include forming Ohmic contacts effectively, prevention of substantial light absorption by the Ohmic contact layer on the path of light reflection towards the metal reflection layer, and avoidance of metals in the metal reflection layer towards the p-type GaN.

SUMMARY

An objective of the present invention is to provide an LED structure having a progressive work function layer. While fabricating the GaN LED, a conversion layer is used as a medium for forming an Ohmic contact between p-type GaN and the metal reflection layer. Instead of a single value, the work function of the conversion layer is progressive for matching the top and bottom connecting layers and endowing the junction with low contact resistance.

Another objective of the present invention is to provide an LED structure having a progressive work function layer. Instead of stacking multiple layers of different materials, the conversion layer can have variations in work function by doping different number of dopants at different depths of a parent material.

Still another objective of the present invention is to provide an LED structure having a progressive work function layer. The conversion layer has high transmissivity. Thereby, the efficiency of LEDs will not be affected on the light reflection path due to substantial absorption.

A further objective of the present invention is to provide an LED structure having a progressive work function layer, which can prevent diffusion of the metals in the metal reflection layer towards the p-type GaN and thus providing the function of a barrier layer.

In order to achieve the objectives described above, the present invention discloses an LED structure having a progressive work function layer, which comprises a semiconductor layer, a conversion layer, a metal reflection layer, a bonding layer, and a substrate. The conversion layer is disposed below the semiconductor layer. The metal reflection layer is disposed below the conversion layer. The bonding layer is disposed below the metal reflection layer. The substrate is disposed below the bonding layer. The conversion layer comprises at least three sub-conversion layers stacked sequentially. In addition, the work functions of the sub-conversion layers decrease gradually from top to bottom. According to the arrangement of the structure, the efficiency of LEDs can be improved.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
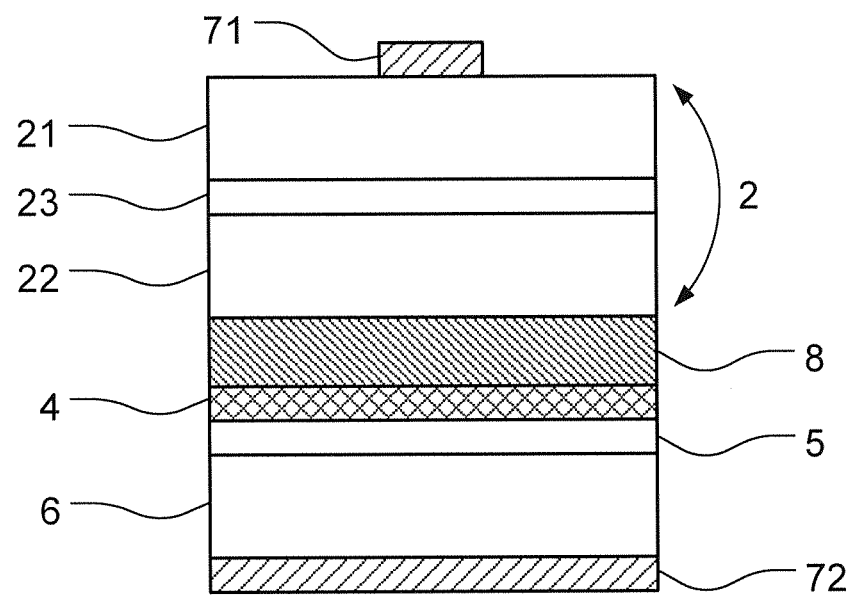
FIG. 1 shows a structural schematic diagram according to the prior art.
Figure 2:
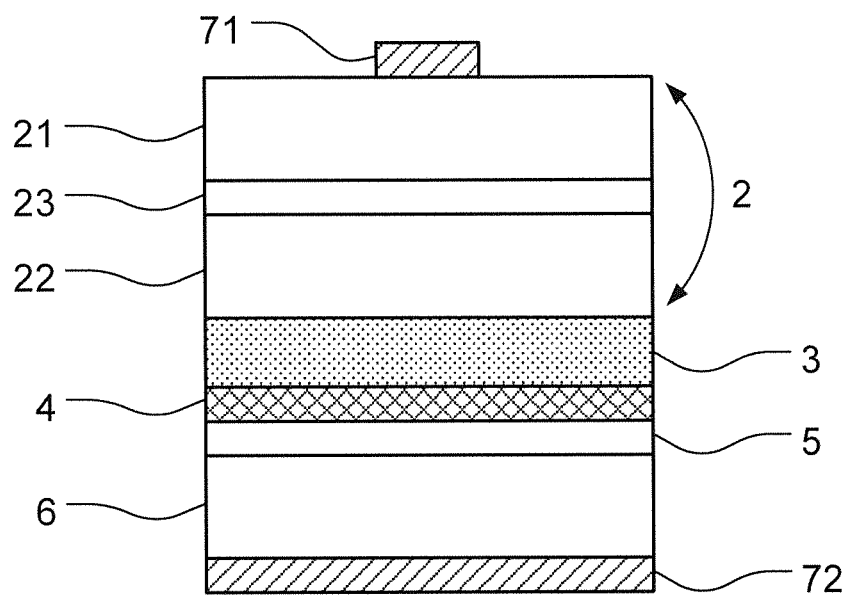
FIG. 2 shows a structural schematic diagram of the LED according a preferred embodiment of the present invention.

Please refer to FIG. 2, which discloses a layered schematic diagram of the structure according to the present invention. The structure according to the present invention comprises a semiconductor layer 2, a conversion layer 3, a metal reflection layer 4, a bonding layer 5, and a substrate 6. The conversion layer 3 is disposed below the semiconductor layer 2; the metal reflection layer 4 is disposed below the conversion layer 3; the bonding layer 5 is disposed below the metal reflection layer 4; and the substrate 6 is disposed below the bonding layer 5.

In addition to the components described above, the structure according to the present invention further comprises a first electrode 71 and a second electrode 72 disposed on the semiconductor 2 and below the substrate 6, respectively. Besides, from top to bottom, the semiconductor layer 2 can be divided into an n-type semiconductor layer 21, a multiple quantum well layer 23, and a p-type semiconductor layer 22.

Figure 3:
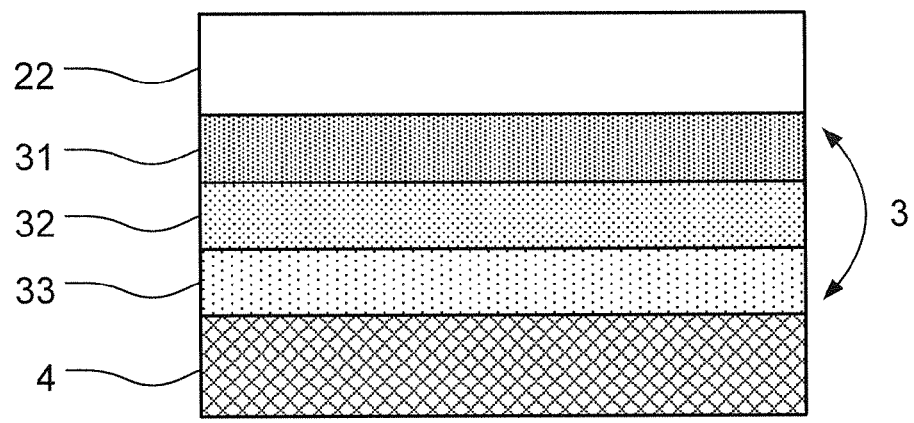
FIG. 3 shows a structural schematic diagram of the conversion layer having a progressive altering work function and the attached layers thereof according to the present invention.
Figure 4:
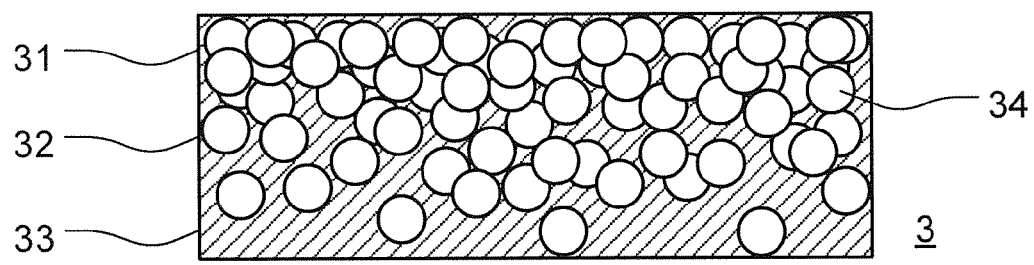
FIG. 4 shows a schematic diagram of the number of dopants at different depths of the conversion layer.

According to the present invention, the disposition and characteristics of the conversion layer 3 are critical technical features. Please refer to FIG. 3. The conversion layer 3 comprises at least three sub-conversion layers stacked sequentially, including a first sub-conversion layer 31, a second sub-conversion layer 32, and a third sub-conversion layer 33 shown in the figure. The difference among these sequentially stacked sub-conversion layers is in their work function. The trend of variation in work function is gradually decreasing from top to bottom. In FIG. 4, the number of dopants 34 in the conversion layer 3 is different at different depths. Thereby, in the schematic diagram, differences occur among the first sub-conversion layer 31, the second sub-conversion layer 32, and the third sub-conversion layer 33.

The present invention includes the conversion layer 3 having progressive work-function variation. The purpose of the conversion layer 3 is to form an Ohmic contact with the metal reflection layer 22 below. Because the p-type semiconductor layer 22 on the conversion layer 3 is p-type GaN, which has a work function of 6.7 eV, much higher than any metal, a Schottky barrier is formed between the p-type semiconductor layer 22 and the metal reflection layer 4 according to the relationship of their work functions. Hence, the conversion layer 3 is required for lowering the contact resistance in this region and thus reducing power dissipation at the contact interface and enhancing the overall performance of LED devices.

Furthermore, the technical means for improving Ohmic contact according to the present invention is to alter the work function of the conversion layer 3, so that a buffer segment of work function can be provided effectively between the p-type semiconductor layer 22 and the metal reflection 4. The material of the conversion layer 3 is tin oxide ($SnO_2$) with a work function of approximately 4.3 eV, which is quite different from the work function, 6.7 eV, of the p-type semiconductor layer 22, namely, p-type GaN. Thereby, according to the present invention, dopants 34 are used. A great number of high-work-function dopants 34 are doped into the first sub-conversion layer 31 of the conversion layer 3 for raising the work function of the segment. According to the present invention, the selected dopant 34 is aluminum nitride (AlN), which has a work function of around 6.3 eV.

Generally, the material of the metal reflection layer 4 is aluminum or silver, trading off between the requested reflection performance and cost. Nonetheless, the work functions of aluminum and silver are very close. The former is approximately 4.28 eV, while the latter is around 4.26 eV; both are quite close to that of undoped tin oxide. Thereby, in the conversion layer 3, no dopant 34 is doped to the third sub-conversion layer 33 contacting the metal reflection layer 4 directly for adjusting the work function. Likewise, the second sub-conversion layer 32 located between the first and third sub-conversion layers 31, 33 is doped with a moderate amount of aluminum nitride. Accordingly, the work function of the conversion layer 3 decreases sequentially in the order of first, second and third sub-conversion layers 31, 32, 33. Finally, the variation of work functions can be controlled to follow the relation of $\Phi_{22}>\Phi_{31}>\Phi_{32}>\Phi_{33}>\Phi_4$.

Moreover, the division of the conversion layer 3 according to the present invention is not limited to three segments. Instead, finer segmentation can be adopted. The variation in the quantity of dopants 34 should be maintained as linear as possible to the distance to the metal reflection layer 4, so that the variation of work function can be linear in the conversion layer 3 accordingly. As a consequence, the contact resistance between the p-type semiconductor 22 and the metal reflection layer 4 can be lowered, which, in turn, reduces the power consumption at the interface.

The LED according to the present embodiment of the present invention is a thin-film GaN LED. The metal reflection 4 in the structure also suffers the diffusion problem of its composition materials to the p-type semiconductor layer 22. In other words, the composition metals will diffuse to the p-type GaN and affect the electrical characteristics. Nonetheless, according to the present invention, the conversion layer 3 can be disposed between the metal reflection layer 4 and the p-type semiconductor layer 22 and used as a barrier to diffusion of metal elements for avoiding the efficiency problem caused by diffusion.

Below the metal reflection layer 4, there are the bonding layer 5 and the substrate 6 sequentially. The bonding layer 5 is used for bonding the metal reflection layer 4 to the substrate 6 and the material of the bonding layer 6 is also metal. As for the substrate 6, a copper substrate is generally adopted.

Figure 5:
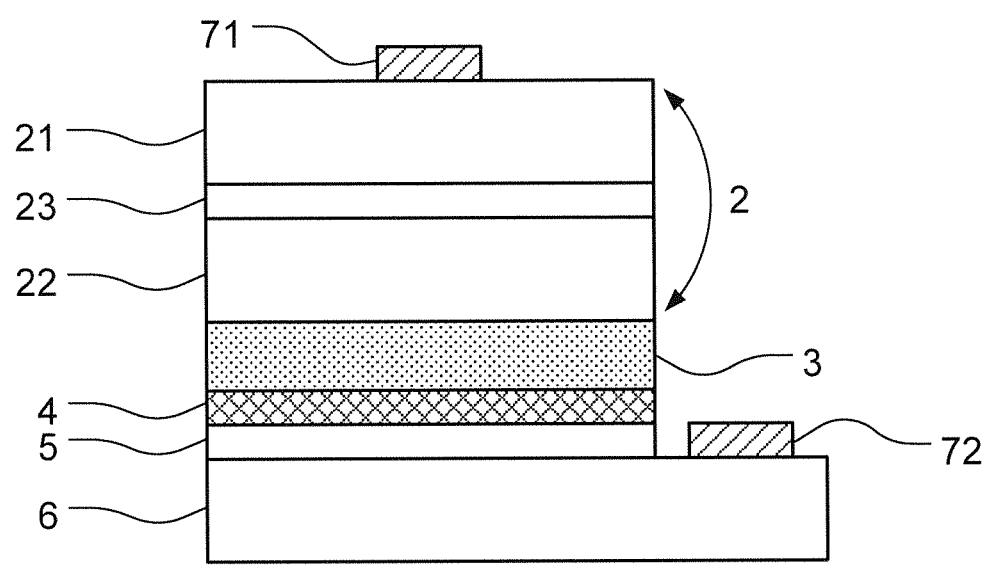
FIG. 5 shows a structural schematic diagram of the LED according another preferred embodiment of the present invention.

According to the present embodiment, the first and second electrodes 71, 72 made of chrome/gold are disposed on the semiconductor layer 1 and below the substrate, respectively, and thus forming a vertical LED. Alternatively, as shown in FIG. 5, the second electrode 72 can be disposed on the region of the substrate 6 not covered by the bonding layer 5.

Figure 6:
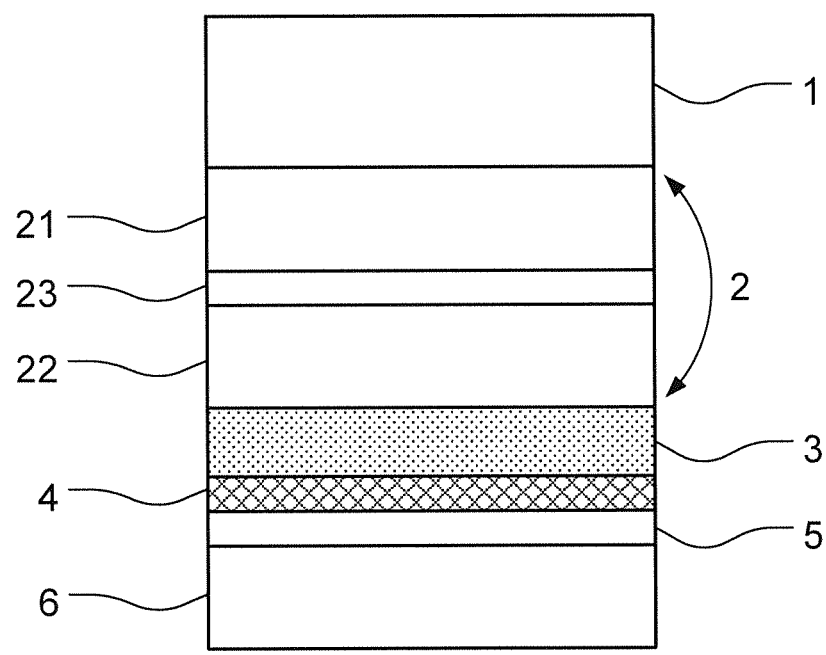
FIG. 6 shows a structural schematic diagram in the fabrication process of the present invention.

FIG. 6 shows a structural schematic diagram in the fabrication process of the present invention. Due to the limitations of epitaxy conditions, current GaN LEDs adopt sapphire as the substrate material. Nonetheless, the thermal conductivity of sapphire substrates is extremely poor, so the light-emitting efficiency of LEDs is deteriorated significantly. Thereby, the sapphire substrate 1 will be removed eventually and the substrate 6 is used as the carrying component. Consequently, the steps of laser lift-off and wafer bonding are required in the fabrication process.

Compared with the high absorptivity of the Ohmic contact layer according to the prior art, which leads to lower light-emitting efficiency owing to the absorption of the light generated by the multiple quantum well layer 23 by the Ohmic contact layer as the light travels to the metal reflection layer 4, the conversion layer 3 according to the present invention has high transmissivity, which can mitigate the decay problem on the light path during reflection.

To sum up, the present invention discloses in details an LED structure having a progressive work function layer, which adopts a conversion layer with a gradually varying work function as the medium for forming an Ohmic contact between the p-type GaN and the metal reflection layer. The work function of the conversion layer is not a single value. Instead, different quantities of dopants are doped at different depths of the conversion layer. Thereby, in addition to having a progressive work function, the conversion layer can match excellently the connected p-type GaN and the metal aluminum or silver, which is used for reflection. According to the technical feature, the present invention can replace the thin metal film according to the prior art and be used as the Ohmic contact layer and the barrier layer. Moreover, by taking advantage of the high light transmissivity of the material of the conversion layer, the possibility that light is absorbed by the Ohmic contact layer is reduced. Thus, the efficiency of LEDs can be improved. In conclusion, the present invention undoubtedly provides an LED structure having a progressive work function layer with fully proven utility.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A light-emitting diode structure having a progressive work function layer, comprising:
   a semiconductor layer;
   a conversion layer, disposed below said semiconductor layer;
   a metal reflection layer, disposed below said conversion layer;
   a bonding layer, disposed below said metal reflection layer; and
   a substrate, disposed below said bonding layer; wherein said conversion layer comprises at least three sub-conversion layers stacked sequentially and with gradually decreasing work functions from top to bottom;
   wherein the conversion layer comprises a plurality of dopants, and the number of said plurality of dopants decreases gradually from the interface between said conversion layer and said semiconductor layer to the interface between said conversion layer and said metal reflection layer.

2. The light-emitting diode structure of claim 1, wherein said semiconductor layer further comprises, from top to bottom, an n-type semiconductor layer, a multiple quantum well layer, and a p-type semiconductor layer stacked sequentially, and said conversion layer contacts said p-type semiconductor layer.

3. The light-emitting diode structure of claim 2, wherein the material of said p-type semiconductor layer is p-type gallium nitride.

4. The light-emitting diode structure of claim 1, wherein the material of said conversion layer is tin oxide.

5. The light-emitting diode structure of claim 1, wherein said plurality of dopants are aluminum nitride.

6. The light-emitting diode structure of claim 1, and further comprising a first electrode disposed on said semiconductor layer.

7. The light-emitting diode structure of claim 1, and further comprising a second electrode disposed on said semiconductor layer and exposed outside said bonding layer.

8. The light-emitting diode structure of claim 1, and further comprising a second electrode disposed below said substrate.

* * * * *